US006656389B2

United States Patent
Iruvanti et al.

(10) Patent No.: US 6,656,389 B2
(45) Date of Patent: Dec. 2, 2003

(54) THERMAL PASTE FOR LOW TEMPERATURE APPLICATIONS

(75) Inventors: Sushumna Iruvanti, Wappingers Falls, NY (US); Edward Louis Yankowski, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 09/895,650

(22) Filed: Jun. 29, 2001

(65) Prior Publication Data

US 2003/0004066 A1 Jan. 2, 2003

(51) Int. Cl.$^7$ ................................................. H01B 1/00
(52) U.S. Cl. ........................ 252/500; 252/512; 252/513; 252/514; 427/97; 361/748; 428/901
(58) Field of Search .................................. 252/500, 512, 252/513, 514; 427/97; 361/748; 428/901

(56) References Cited

U.S. PATENT DOCUMENTS

| | | | |
|---|---|---|---|
| 5,098,609 A | 3/1992 | Iruvanti et al. | ............. 252/511 |
| 5,591,789 A | 1/1997 | Iruvanti et al. | ............. 523/515 |
| 5,977,490 A | * 11/1999 | Kawakita et al. | ............ 174/265 |
| 6,139,777 A | * 10/2000 | Omoya et al. | ............. 252/500 |

OTHER PUBLICATIONS

Condea Vista Company—Technical Data Sheet—"Nalkylene 590L Alkylate" no date—date required.

* cited by examiner

*Primary Examiner*—Yogendra N. Gupta
*Assistant Examiner*—Derrick G. Hamlin
(74) *Attorney, Agent, or Firm*—Ira D. Blecker

(57) ABSTRACT

A thermal paste for low temperature applications made from a combination of a thermally conducting solid filler, dispersant and linear alkylbenzene carrier. The thermal paste may be applied to an electronic component to increase the cooling of the electronic component.

16 Claims, 5 Drawing Sheets

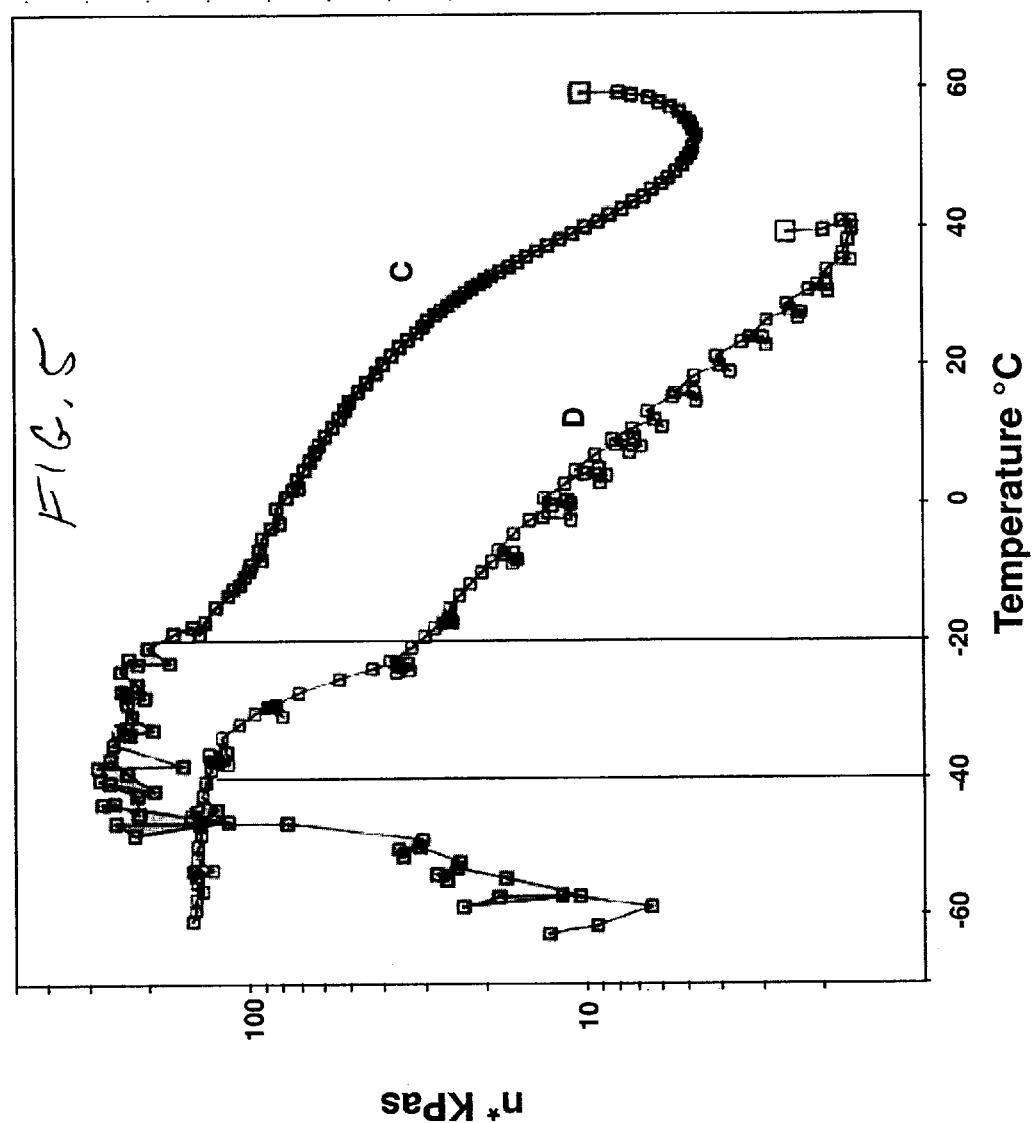

THERMAL PASTE FOR LOW TEMPERATURE APPLICATIONS

BACKGROUND OF THE INVENTION

The present invention relates to the field of high thermal conductivity pastes which are used as a heat transfer means for cooling electronic components and, in particular, relates to a high thermal conductivity paste which is useful in cooling under low temperature conditions.

Electronic components generate heat and in many applications the heat needs to be effectively dissipated for the device to function properly. In electronic components such as semiconductor devices and the like, the need to achieve greater computer speeds and the miniaturization of electronic components has resulted in electronic components which generate more heat. The use of such electronic components is only practicable, however, when the heat generated is effectively removed from the active components and a number of techniques have been developed to cool such electronic components.

Various systems have been disclosed in the art for providing a separate cooling member to cool the electronic component. Fins, channels, baffles, caps and other heat exchanger type devices have been developed to remove heat from the electronic component. In some cases, the electronic component, and perhaps other portions of the overall electronic assembly as well, are refrigerated to below room temperature in an effort to more effectively cool the electronic component.

In most of these cooling devices there is an air space between the electronic component to be cooled and the cooling device which air space has a relatively low heat transfer rate. To overcome this problem, thermal compounds commonly referred to as thermal greases or thermal pastes (hereafter collectively referred to as thermal pastes) have been developed to enhance the transfer of heat from the electronic component to the cooling device by contacting and connecting both surfaces and providing a high heat transfer conducting means. The thermal paste must have high thermal conductivity and preferably be an electrical insulator. The paste must also have a low viscosity and be compliant so that the thermal paste can be easily applied to the surfaces of the electronic component to be cooled and can conform with the microscopically rough surface of the electronic component which are often bowed or tilted to minimize air gaps which are detrimental to the cooling process. Low viscosity is also important because the electronic components are fragile and the force needed to apply the thermal paste must be minimal. It is a further requirement that the thermal paste be able to withstand power cycling and the mechanical stresses arising from the differences in coefficient of thermal expansion of the electronic component, thermal paste and cooling system over the life of the component without the thermal paste degrading significantly in thermal conductivity or mechanically, such as experiencing phase separation between the liquid and solid components of the thermal paste.

A number of thermal pastes have been developed to be used in electronic systems and, in general, the thermal paste comprises thermally conductive filler particles and a dispersant in a liquid dielectric carrier.

Iruvanti et al. U.S. Pat. No. 5,098,609, the disclosure of which is incorporated by reference herein, discloses stable high solids, high thermal conductivity thermal pastes which contain a stabilizing dispersant to inhibit liquid-solid separation and which facilitate incorporation of more solid fillers into the paste. The liquid dielectric carrier is selected from paraffinic hydrocarbons, such as mineral oil, silicone oils, mixtures of glycerides, halogenated hydrocarbons, olefinic hydrocarbons, aromatic hydrocarbons and mixtures of two or more of the above carriers.

Iruvanti et al. U.S. Pat. No. 5,591,789, the disclosure of which is incorporated by reference herein, discloses a high thermal conductivity paste having a polyester dispersant. The liquid dielectric carrier is a poly(alpha-olefin) oil.

In certain cooling applications where the electronic component is refrigerated or otherwise cooled in some manner, it is still necessary to be able to efficiently remove heat from the electronic component. Accordingly, thermal pastes are desirable even in low temperature applications (e.g., room temperature to −30°). However, none of the thermal pastes disclosed in the above references are suitable for low temperature applications because the pastes become too hard.

It would be desirable to have a thermal paste that remains soft and sticky under low temperature conditions.

Accordingly, it is a purpose of the present invention to have a thermal paste that remains soft and sticky under low temperature conditions.

It is another purpose of the present invention to have a thermal paste for low temperature conditions that is easily manufactured from commercially available components.

Another aspect of the invention is to provide a thermal paste that can be easily cleaned with common solvents to enable rework of electronic components. Thermal pastes or greases made with silicone oil generally are difficult to clean, and often require environmentally unacceptable solvents such as methylene chloride.

Accordingly, it is yet another purpose of the present invention to have a thermal paste that can be easily cleaned with common solvents to enable rework of electronic components.

These and other purposes of the present invention will become more apparent after referring to the following invention considered in conjunction with the accompanying drawings.

BRIEF SUMMARY OF THE INVENTION

The purposes of the invention have been achieved by providing, according to a first aspect of the present invention, a thermal paste for low temperature applications comprising:

a thermally conducting solid filler;

a dispersant; and a linear alkylbenzene liquid carrier.

According to a second aspect of the present invention, there is provided a method for increasing the cooling of an electronic component by the use of a cooling member proximate to the electronic component comprising the step of:

applying a thermal paste to the surface of the electronic component and the cooling member, the thermal paste comprising a thermally conducting solid filler, a dispersant, and a linear alkylbenzene liquid carrier.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIG. 5 is a graph of complex viscosity versus temperature for a thermal paste according to the present invention compared to a prior art thermal paste.

DETAILED DESCRIPTION OF THE INVENTION

Figure 1:
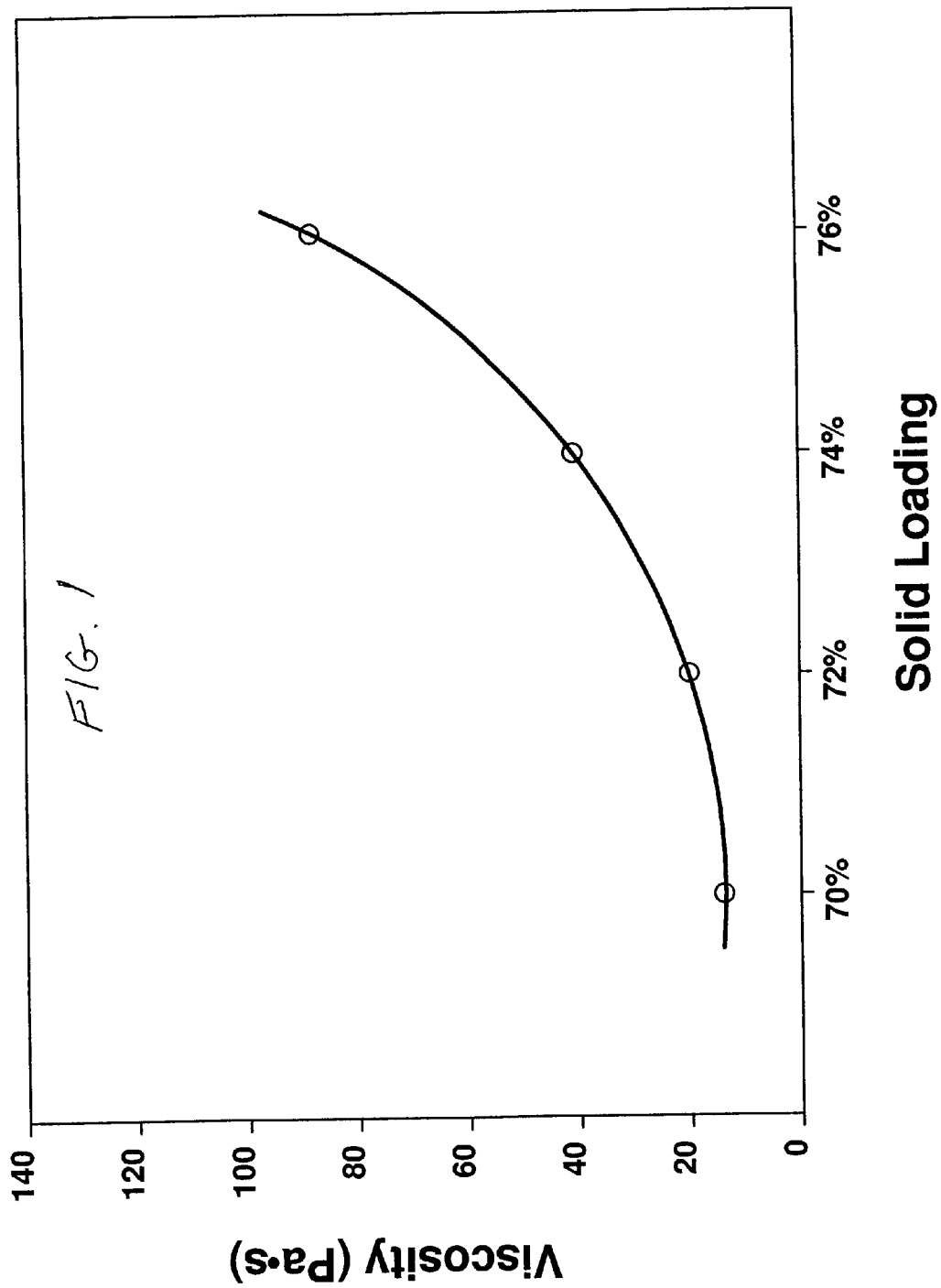
FIG. 1 is a graph of steady shear viscosity versus solid loading (vol %) for a thermal paste according to the present invention.

According to the present invention, there is disclosed a thermal paste for low temperature applications. By low temperature applications, it is meant that the environment in which the thermal paste is used has an ambient temperature of room temperature to −30° C. Unlike the prior art pastes made with non-silicone oil which turn stiffer and harder at −20 to −30° C., the paste according to the present invention remains soft and sticky at −20 to −30° C. The thermal paste according to the present invention comprises a thermally conducting solid filler, a dispersant and a linear alkylbenzene liquid carrier.

The thermally conductive filler particles may be selected from a wide variety of materials which exhibit a relatively high thermal conductivity such as boron nitride, vanadium boride and aluminum spheres as illustrated in more detail below. The particles are preferably electrical insulators. The preferred shape is spherical, cubic, or irregular so that packing density is maximized while providing a low viscosity of the dispersion of particles in the liquid carrier. Other shaped materials such as platelets may be used. A mixture of particle size distribution is preferred.

The thermally conductive filler particles are preferably treated before they are dispersed in the liquid carrier so that their surface is modified. The particles may be modified by heat treating such as calcining in air in order to remove low surface energy organic contaminants absorbed from the ambient so they have a higher surface energy than the liquid carrier and are wetted by the liquid carrier. Exemplary metal fillers which may be used in the invention include aluminum, silicon, copper and silver. Ceramic fillers such as silicon carbide, aluminum nitride, boron nitride, vanadium boride, diamond, aluminum oxide, zinc oxide, magnesiumn oxide and silicon dioxide may be employed. Mixtures of fillers may also be utilized to provide a paste having certain features depending upon the application. It is preferred that the particle size of the solid fillers be between 0.05 and 30 microns although lower and higher particle sizes may also be used depending on the application. In a most preferred embodiment of the present invention, the filler particles consist of a combination of aluminum and aluminum oxide fillers and have a particle size of 0.1 to 15 microns.

The thermally conductive filler particles in the thermal paste will generally be in the range of 64 to 78 volume percent and, more preferably, in the range of 72 to 78 volume percent.

The dispersant is a substance which will inhibit liquid-solid separation and which will facilitate incorporation of more solid fillers into the thermal paste. Examples of dispersants suitable for the present invention include monomeric acids; monomeric, oligomeric and/or polymeric fatty acid esters and salts thereof; petroleum sulfonates; and polyimides, all of which were disclosed in the above Iruvanti et al. U.S. Pat. No. 5,098,609.

Particularly preferred for the present invention is the polyester dispersant disclosed in the above Iruvanti et al. U.S. Pat. No. 5,591,789. As noted in the latter, it has been found that when a hydroxy-fatty acid or mixture of hydroxy fatty acids is self condensed and the reaction controlled to produce a reaction product having an acid number of about 30 to 100, use of this reaction product as a dispersant provides a thermal paste having enhanced thermal and paste properties. The acid number is a well known value associated with the acid strength of a substance and is defined as the milligrams of KOH (potassium hydroxide) required to neutralize the acid in a one gram sample of the product being measured. The higher the amount of acid in the sample the more KOH needed to neutralize the acid and the higher the acid number. Salts of the polyesters may also be employed in the invention and include alkali metal salts and alkaline earth metal salts. It is preferred that there be 2.0 to 5 weight percent, and most preferably 2 to 3 weight percent, of dispersant.

As a third constituent, the thermal paste comprises a low pour point (temperature below which the viscosity of the fluid increases so much that it can not be pumped easily) liquid carrier. Examples of low pour point carriers include linear alkylbenzenes (mol. Wt. 100–300) such as the commercially available fluids under the trade name of Dynalene® (available from Dynalene Corp., Whilehall, Pa.) and Nalkylene® (available from the Condea Vista Company, Hamburg, Germany). A particularly preferred linear alkylbenzene is the high molecular weight, Nalkylene 590L Alkylate. As disclosed in the Condea Vista Company's literature, Nalkylene 590L is produced by reacting olefins with benzene using hydrofluoric acid as the alkylation catalyst. These materials are typically used for making surfactants and detergents. Accordingly, their value as a carrier in a thermal paste was unexpected and surprising.

EXAMPLES

Figure 2:
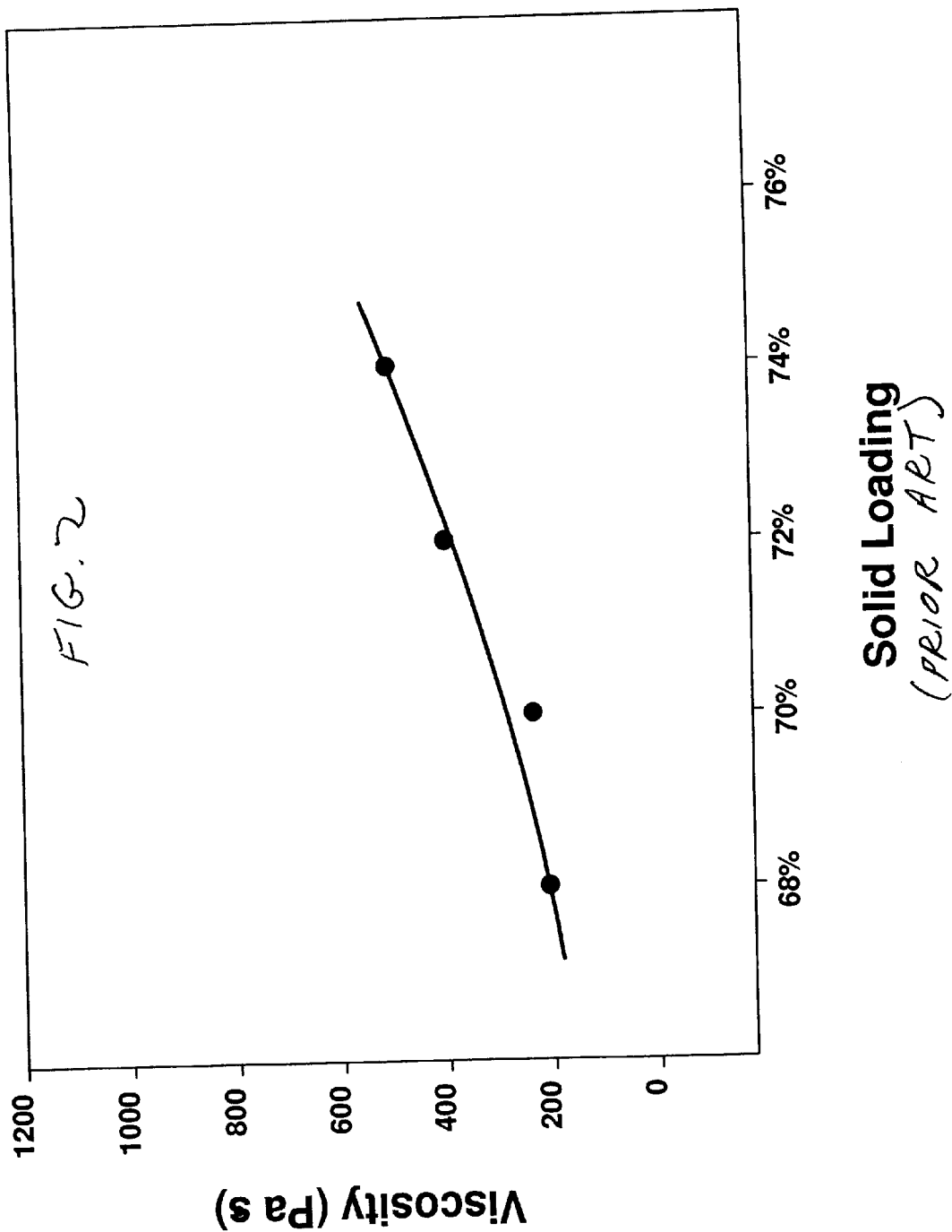
FIG. 2 is a graph of complex viscosity versus solid loading for a thermal paste according to a prior art thermal paste.

A first series of thermal pastes were prepared consisting of 3 weight percent hydroxystearic acid ester dispersant disclosed in the above Iruvanti et al. U.S. Pat. No. 5,591,789, varying amounts (70–76 vol %) of solid loading of thermally conductive particles comprising aluminum and alumina particles in the range of 0.1 to 10 microns and the remainder Nalkylene 590L liquid carrier. Steady shear viscosity of these thermal pastes were measured at 22° C. and 160 s$^{-1}$. The results are graphically illustrated in FIG. 1. As shown in FIG. 1, the viscosity increases exponentially with solid loading, but the magnitude is relatively less compared to a prior art thermal paste disclosed in Iruvanti et al. U.S. Pat. No. 5,098,609. For comparison, FIG. 2 shows the complex viscosity as a function of solid loading for prior art thermal pastes made the same way as those in FIG. 1, except for the liquid carrier. In FIG. 2 the pastes were made with a poly alpha olefin (PAO) oil. The viscosity values in FIG. 2 were measured dynamically at 130° C., 1 Hz and 1% strain, on a parallel plate viscometer with 40 mm diameter plate and 0.5 mm gap. It is seen that the viscosity of the thermal pastes of the present invention were lower at 22° C. shown in FIG. 1 compared to those of the prior art thermal pastes at 130° C.

shown in FIG. 2. This is to be contrasted with the general convention that paste viscosities typically drop with increasing temperature.

Figure 3:
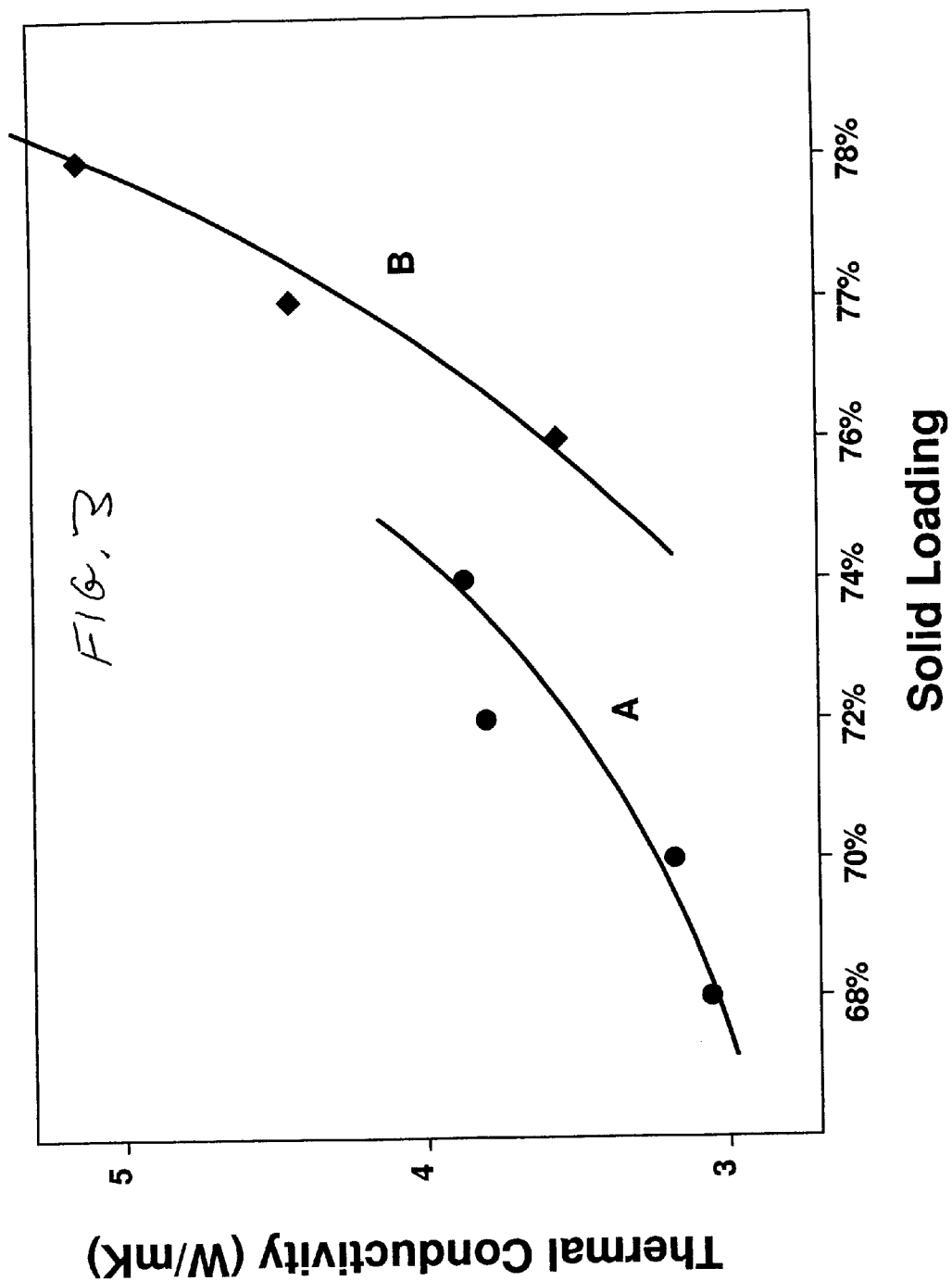
FIG. 3 is a graph of thermal conductivity versus solid loading for a thermal paste according to the present invention compared to a prior art thermal paste.

A second series of thermal pastes were prepared consisting of varying amounts of aluminum and aluminum oxide particles, 3 weight percent of the above hydroxystearic acid ester dispersant and the remainder either PAO oil or Nalkylene 590L as the liquid carrier. The thermal conductivity for these thermal pastes was measured at 60° C. The results are graphically illustrated in FIG. 3. The PAO oil data is labelled A and the Nalkylene 590L oil data is labelled B in FIG. 3. With PAO oil, beyond 74 vol % solids, the thermal paste viscosity increases so much that the thermal paste becomes too stiff and hard. However, because of the lower viscosity of the Nalkylene 590L oil thermal pastes, higher solid loadings are possible and higher solid loadings yield higher thermal conductivity thermal pastes as shown in FIG. 3.

Figure 4:
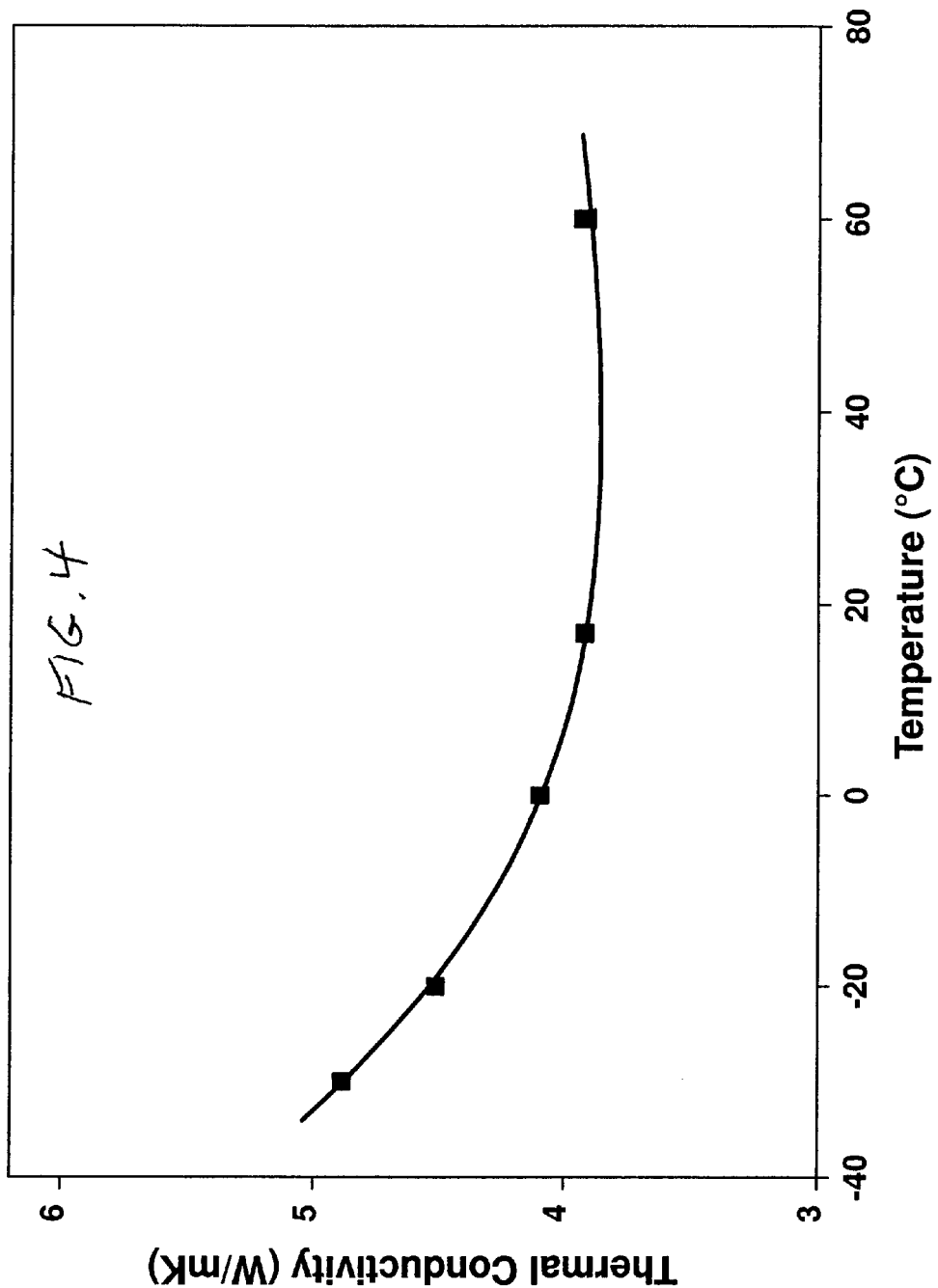
FIG. 4 is a graph of thermal conductivity versus temperature for a thermal paste according to the present invention.

FIG. 4 shows the thermal conductivity versus temperature for a formulation of the present invention made with 76 vol % solids, 3 wt % of the above stearic acid ester dispersant and the remainder Nalkylene 590L carrier. The thermal conductivity of the thermal paste increases with decreasing temperature as expected. The thermal paste remains soft and sticky down to the −30° C. temperature.

FIG. 5 shows complex viscosity as a function of temperature for a paste formulation of the present invention and one of the prior art. The dynamic viscosity measurements were made at 1 Hz, 1 mm gap on a 25 mm Parallel plate viscometer. The present invention formulation (with Nalkylene 590L oil) had 76 vol % solids and the prior art formulation (with PAO oil) had 74 vol % solids as described above with reference to FIG. 3. It is seen that the viscosity increases with decreasing temperature for both the formulations. The prior art formulation (curve C) shows a transition (meaning that the paste is becoming hard and is losing pastiness) around −20° C. and by −50° C. the paste has turned so hard that the adhesion to the plate is lost and the torque value and hence the complex viscosity drops off (the viscosity is not measurable). The present invention formulation shows a transition close to −40° C. However, beyond −40° C. and even down to −60° C., the drop off in torque readings, or complex viscosity is not observed. This demonstrates the compliance of the pastes made with Nalkylene 590L oil at low temperatures down to at least −40° C.

In order to further demonstrate the compliance of the present invention thermal pastes at low temperatures, a sample of the present invention thermal paste with Nalkylene 590L oil (77 vol % solids) and a sample of the prior art thermal paste with PAO oil (74 vol % solids) were sandwiched between a silicon wafer and an aluminum plate. The sandwiches were left in a freezer at −45° C. for 500 hours. When the sandwiches were removed from the freezer, the prior art paste was found to be hard, brittle and non-sticky, while the present invention paste was still soft, sticky and compliant (i.e., the preferred characteristics).

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A thermal paste for low temperature applications comprising:

a thermally conducting solid filler;

a dispersant; and a linear alkylbenzene liquid carrier.

2. The thermal paste of claim 1 wherein the proportions of the constituents of the thermal paste are 64 to 80 volume percent thermally conducting solid filler 1 to 5 weight percent dispersant and remainder linear alkylbenzene liquid carrier.

3. The thermal paste of claim 1 wherein the proportions of the constituents of the thermal paste are 74 to 78 volume percent thermally conducting solid filler, 2 to 3 weight percent dispersant and remainder linear alkylbenzene liquid carrier.

4. The thermal paste of claim 1 wherein the thermal paste remains compliant in the range of room temperature to −30° C.

5. The thermal paste of claim 1 wherein the thermally conducting filler material is aluminum and aluminum oxide.

6. The thermal paste of claim 1 wherein the thermally conducting filler material is selected from the group consisting of aluminum, silicon, copper, silver, silicon carbide, aluminum nitride, boron nitride, diamond, aluminum oxide, zinc oxide, magnesium oxide, silicon dioxide, vanadium boride and mixtures thereof.

7. The thermal paste of claim 1 wherein the thermally conducting filler material has a particle size of about 0.05 to 30 microns.

8. The thermal paste of claim 1 wherein the linear alkylbenzene liquid carrier has a molecular weight of 100 to 300.

9. A method for increasing the cooling of an electronic component by the use of a cooling member proximate to the electronic component comprising the step of:

applying a thermal paste to the surface of the electronic component and the cooling member, the thermal paste comprising a thermally conducting solid filler, a dispersant, and a linear alkylbenzene liquid carrier.

10. The method of claim 9 wherein the proportion of the thermal paste are 64 to 80 volume percent thermally conducting solid filler, 1 to 5 weight percent dispersant and remainder linear alkylbenzene liquid carrier.

11. The method of claim 9 wherein the proportions of the constituents of the thermal paste are 74 to 78 volume percent thermally conducting solid filler, 2 to 3 weight percent dispersant and remainder linear alkylbenzene liquid carrier.

12. The method of claim 9 wherein the thermal paste remains compliant in the range of room temperature to −30° C.

13. The method of claim 9 wherein the thermally conducting filler material is aluminum and aluminum oxide.

14. The method of claim 9 wherein the thermally conducting filler material is selected from the group consisting of aluminum, silicon, copper, silver, silicon carbide, aluminum nitride, boron nitride, diamond, aluminum oxide, zinc oxide, magnesium oxide, silicon dioxide, vanadium boride and mixtures thereof.

15. The method of claim 9 wherein the thermally conducting filler material has a particle size of about 0.05 to 30 microns.

16. The method of claim 9 wherein the liner alkylbenzene liquid carrier has a molecular weight of 100 to 300.

* * * * *